US010032741B2

(12) United States Patent
Oda et al.

(10) Patent No.: US 10,032,741 B2
(45) Date of Patent: Jul. 24, 2018

(54) BONDING WIRE FOR SEMICONDUCTOR DEVICE

(71) Applicants: NIPPON MICROMETAL CORPORATION, Saitama (JP); NIPPON STEEL & SUMIKIN MATERIALS CO., LTD., Tokyo (JP)

(72) Inventors: Daizo Oda, Saitama (JP); Motoki Eto, Saitama (JP); Takashi Yamada, Saitama (JP); Teruo Haibara, Saitama (JP); Ryo Oishi, Saitama (JP); Tomohiro Uno, Tokyo (JP); Tetsuya Oyamada, Tokyo (JP)

(73) Assignees: NIPPON MICROMETAL CORPORATION, Saitama (JP); NIPPON STEEL & SUMIKIN MATERIALS CO., LTD., Tokyo (JP)

( * ) Notice: Subject to any disclaimer, the term of this patent is extended or adjusted under 35 U.S.C. 154(b) by 0 days.

(21) Appl. No.: 15/107,417

(22) PCT Filed: Jun. 5, 2015

(86) PCT No.: PCT/JP2015/066385
§ 371 (c)(1),
(2) Date: Jun. 22, 2016

(87) PCT Pub. No.: WO2016/135993
PCT Pub. Date: Sep. 1, 2016

(65) Prior Publication Data
US 2017/0323864 A1  Nov. 9, 2017

(30) Foreign Application Priority Data

Feb. 26, 2015 (JP) ................. 2015-036342

(51) Int. Cl.
*H01L 23/00* (2006.01)
(52) U.S. Cl.
CPC .............. *H01L 24/45* (2013.01); *H01L 24/48* (2013.01); *H01L 24/85* (2013.01); *H01L 2224/05624* (2013.01); *H01L 2224/45005* (2013.01); *H01L 2224/45109* (2013.01); *H01L 2224/45147* (2013.01); *H01L 2224/45572* (2013.01); *H01L 2224/45609* (2013.01); *H01L 2224/45644* (2013.01); *H01L 2224/45664* (2013.01); *H01L 2224/48465* (2013.01); *H01L 2224/48824* (2013.01); *H01L 2224/8509* (2013.01); *H01L 2224/85045* (2013.01); *H01L 2224/85054* (2013.01); *H01L 2224/85075* (2013.01); *H01L 2924/01005* (2013.01); *H01L 2924/01012* (2013.01); *H01L 2924/01015* (2013.01); *H01L 2924/01028* (2013.01); *H01L 2924/01031* (2013.01); *H01L 2924/01032* (2013.01); *H01L 2924/01045* (2013.01); *H01L 2924/01046* (2013.01); *H01L 2924/01078* (2013.01)

(58) Field of Classification Search
CPC ......... H01L 24/43; H01L 24/45; H01L 24/48; H01L 24/85
See application file for complete search history.

(56) References Cited

U.S. PATENT DOCUMENTS

| | | |
|---|---|---|
| 2004/0065468 A1 | 4/2004 | Seuntjens |
| 2006/0186544 A1 | 8/2006 | Won et al. |
| 2010/0294532 A1 | 11/2010 | Uno et al. |
| 2012/0118610 A1 | 5/2012 | Terashima et al. |
| 2013/0306352 A2 | 11/2013 | Terashima et al. |
| 2015/0322586 A1* | 11/2015 | Lyn .................. H01L 24/45 428/613 |

FOREIGN PATENT DOCUMENTS

| | | |
|---|---|---|
| CN | 1318011 A | 10/2001 |
| CN | 102422404 A | 4/2012 |
| CN | 103943584 A | 7/2014 |
| CN | 104157625 A | 11/2014 |

(Continued)

OTHER PUBLICATIONS

Search Report International Application No. PCT/JP2015/066385 dated Aug. 25, 2015.
Notification of Reasons for Refusal Japanese Patent Application No. 2015-532223 dated Sep. 24, 2015 with full English translation.
Notification of Reasons for Refusal Japanese Patent Application No. 2015-532223 dated Jan. 5, 2016 with full English translation.
Decision to Grant a Patent Japanese Patent Application No. 2015-532223 dated Mar. 1, 2016 with full English translation.
Partial Supplementary European Search Report issued in corresponding EP Patent Application No. 15866377.3, dated Jan. 10, 2017.

(Continued)

*Primary Examiner* — Cuong Q Nguyen
(74) *Attorney, Agent, or Firm* — McDermott Will & Emergy LLP

(57) ABSTRACT

There is provided a Cu bonding wire having a Pd coating layer on a surface thereof, that improves bonding reliability of a ball bonded part in a high-temperature and high-humidity environment and is suitable for on-vehicle devices. The bonding wire for a semiconductor device includes a Cu alloy core material and a Pd coating layer formed on a surface of the Cu alloy core material, and the bonding wire contains In of 0.011 to 1.2% by mass and has the Pd coating layer of a thickness of 0.015 to 0.150 µm. With this configuration, it is able to increase the bonding longevity of a ball bonded part in a high-temperature and high-humidity environment, and thus to improve the bonding reliability. When the Cu alloy core material contains one or more elements of Pt, Pd, Rh and Ni in an amount, for each element, of 0.05 to 1.2% by mass, it is able to increase the reliability of a ball bonded part in a high-temperature environment of 175° C. or more. When an Au skin layer is further formed on a surface of the Pd coating layer, wedge bondability improves.

8 Claims, No Drawings

(56) References Cited

FOREIGN PATENT DOCUMENTS

| | | |
|---|---|---|
| EP | 2413351 A1 | 2/2012 |
| EP | 2461358 A1 | 6/2012 |
| JP | 61-48543 A | 3/1986 |
| JP | S61-163194 A | 7/1986 |
| JP | S61-255045 A | 11/1986 |
| JP | S62-130248 A | 6/1987 |
| JP | S63-235440 A | 9/1988 |
| JP | S63-241127 A | 10/1988 |
| JP | S63-247325 A | 10/1988 |
| JP | H08-319525 A | 12/1996 |
| JP | 2002-359261 A | 12/2002 |
| JP | 2005-167020 A | 6/2005 |
| JP | 2006-100777 A | 4/2006 |
| JP | 2008-085320 A | 4/2008 |
| JP | 2009-158931 A | 7/2009 |
| JP | 4637256 B1 | 2/2011 |
| JP | 2012-036490 A | 2/2012 |
| WO | 2009/093554 A1 | 7/2009 |

OTHER PUBLICATIONS

Jae-Hyung Cho, et al. "Investigation of Recrystallization and Grain Growth of Copper and Gold Bonding Wires", Metallurgical and Materials Transations, 37(10): pp. 3085-3097 (2006).

Extended European Search Report issued in corresponding EP Patent Application No. 15866377.3, dated May 2, 2017.

Chinese Office Action issued in corresponding Chinese Patent Application No. 201580002609.5, dated Mar. 20, 2018, with English Translation.

* cited by examiner

BONDING WIRE FOR SEMICONDUCTOR DEVICE

CROSS-REFERENCE TO RELATED APPLICATIONS

This application is the U.S. National Phase of PCT/JP2015/066385 filed Jun. 5, 2015, which claims priority to Japanese Patent Application No. 2015-036342 dated Feb. 26, 2015. The subject matter of each is incorporated herein by reference in entirety.

TECHNICAL FIELD

The present invention relates to a bonding wire for a semiconductor device used to connect electrodes on a semiconductor device and wiring of a circuit wiring board such as external leads.

BACKGROUND ART

As a bonding wire for a semiconductor device which connects electrodes on a semiconductor device and external leads (hereinafter referred to as a "bonding wire"), a thin wire with a wire diameter of about 15 to 50 μm is mainly used today. For a bonding method with bonding wire, there is generally used a thermal compressive bonding technique with the aid of ultrasound, in which a general bonding device, a capillary tool used for bonding by passing a bonding wire therethrough, and the like are used. A bonding process of a bonding wire is carried out by heating and melting a tip of wire by arc heat input to form a ball (FAB: free air ball) through surface tension; crimp-bonding the ball part onto an electrode of the semiconductor device heated within a range of 150 to 300° C. (hereinafter referred to as "ball bonding"); forming a loop; and finally crimp-bonding a wire part onto an electrode of the external lead (hereinafter referred to as "wedge bonding"). For the electrode on the semiconductor device as an object to be bonded with the bonding wire, there is used an electrode structure in which a film of alloy mainly containing Al is formed on a Si substrate. For the electrode of the external lead, there is used an electrode structure with Ag plating or Pd plating.

Although Au has been mainly used for a material of the bonding wire, a replacement of Au with Cu is being conducted mainly in LSI use. On the background of recent proliferation of electric vehicles and hybrid vehicles, needs for replacing Au with Cu are increasing also in on-vehicle device use.

As for a Cu bonding wire, there has been proposed a wire using high-purity Cu (purity: 99.99% by mass or more) (for example, Patent Literature 1). Cu has the drawback of being more susceptible to oxidation than Au and has problems in that bonding reliability, ball formability and wedge bondability are inferior. As a method for preventing surface oxidation of a Cu bonding wire, there has been proposed a structure in which a surface of Cu core material is coated with a metal such as Au, Ag, Pt, Pd, Ni, Co, Cr and Ti (Patent Literature 2). There has been also proposed a structure in which a surface of Cu core material is coated with Pd and a surface thereof is coated with Au, Ag, Cu or an alloy thereof (Patent Literature 3).

RELATED ART REFERENCE

Patent Literature

Patent Literature 1: JP-A-S61-48543
Patent Literature 2: JP-A-2005-167020
Patent Literature 3: JP-A-2012-36490

SUMMARY OF INVENTION

Problem to be Solved by the Invention

In comparison to general electronic devices, on-vehicle devices require bonding reliability in a rigorous high-temperature and high-humidity environment. In particular, the biggest concern is a bonding longevity of a ball bonded part that is formed by bonding a ball of wire to an electrode. Some methods are developed for evaluating the bonding reliability in a high-temperature and high-humidity environment, and a representative evaluation method includes a highly accelerated temperature and humidity stress test (HAST) (a high-temperature and high-humidity environment exposure test). When a bonding reliability of a ball bonded part is evaluated by HAST, a ball bonded part to be evaluated is exposed to a high-temperature and high-humidity environment with a temperature of 130° C. and a relative humidity of 85%, and then, the bonding longevity of the ball bonded part is evaluated by measuring temporal changes in a resistance value of the bonded part or by measuring temporal changes in shear strength of the ball bonded part. There has been recently required a bonding longevity of 100 hours or more in HAST with such conditions.

It has been revealed that, in a case when a conventional Cu bonding wire having a Pd coating layer is used to perform a bonding operation with a pure Al electrode where 1st bonding is ball bonding and 2nd bonding is wedge bonding, followed by performing a sealing operation with a mold resin and evaluating a resulting ball bonded part in the above mentioned HAST condition, the bonding longevity of the ball bonded part may be less than 100 hours, and the bonding reliability thereof is not sufficient for on-vehicle devices.

An object of the present invention is to provide a Cu bonding wire having a Pd coating layer on a surface thereof, that improves bonding reliability of a ball bonded part in a high-temperature and high-humidity environment and is suitable for on-vehicle devices.

Means for Solving Problem

The present invention employs the following structures.

(1) A bonding wire for a semiconductor device comprising: a Cu alloy core material; and a Pd coating layer formed on a surface of the Cu alloy core material, wherein the bonding wire contains In, a concentration of In is 0.011 to 1.2% by mass relative to the entire wire, and a thickness of the Pd coating layer is 0.015 to 0.150 μm.

(2) The bonding wire for a semiconductor device according to (1), wherein the Cu alloy core material contains at least one element selected from Pt, Pd, Rh and Ni, and a concentration of each of the elements contained in the Cu alloy core material is 0.05 to 1.2% by mass.

(3) The bonding wire for a semiconductor device according to (1) or (2), further comprising an Au skin layer on the Pd coating layer.

(4) The bonding wire for a semiconductor device according to (3), wherein a thickness of the Au skin layer is 0.0005 to 0.050 μm.

(5) The bonding wire for a semiconductor device according to any one of (1) to (4), wherein the bonding wire further contains at least one element selected from B, P, Mg, Ga and Ge, and a concentration of each of the elements is 1 to 100 ppm by mass relative to the entire wire.

(6) The bonding wire for a semiconductor device according to any one of (1) to (5), wherein, in a measurement result when measuring crystal orientations on a surface of the bonding wire, a crystal orientation <111> angled at 15 degrees or less to a longitudinal direction of the bonding wire has a proportion of 30 to 100% in terms of areal percentage.

Effect of the Invention

The present invention is a bonding wire for a semiconductor device which includes a Cu alloy core material and a Pd coating layer formed on a surface of the Cu alloy core material. The bonding wire contains In of 0.011 to 1.2% by mass, and thereby, the present invention increases a bonding longevity of a ball bonded part in a high-temperature and high-humidity environment and can improve bonding reliability.

EMBODIMENT FOR CARRYING OUT THE INVENTION

Firstly, the bonding wire of the present invention is a bonding wire for a semiconductor device including a Cu alloy core material and a Pd coating layer formed on a surface of the Cu alloy core material, wherein the bonding wire contains In, a concentration of In is 0.011 to 1.2% by mass relative to the entire wire, and a thickness of the Pd coating layer is 0.015 to 0.150 µm. With this configuration, the bonding wire can improve a bonding reliability of a ball bonded part in a high-temperature and high-humidity environment required for on-vehicle devices.

When a ball is formed using the bonding wire of the present invention by arc discharge, an alloy layer having a higher Pd concentration than an inside of the ball is formed in a surface of the ball during the process when the bonding wire melts and solidifies. Such ball is used to bond with an Al electrode and a high-temperature and high-humidity test is performed, which allows Pd to be concentrated at a bonding interface. A concentrated layer formed by the concentrated Pd can reduce a diffusion of Cu and Al at a bonding interface during a high-temperature and high-humidity test and can reduce a growth rate of corrodible compound. It is thus able to improve the bonding reliability of the bonding wire. If the thickness of the Pd coating layer is less than 0.015 µm, the concentrated layer is not sufficiently formed, and the bonding reliability cannot be improved. The thickness of the Pd coating layer is more preferably 0.02 µm or more. On the other hand, if the thickness of the Pd coating layer exceeds 0.150 µm, FAB shape tends to remarkably degrade, and an upper limit thereof is 0.150 µm.

The alloy layer with a high Pd concentration formed on a surface of the ball is excellent in oxidation resistance and can thereby reduce failures such as deviation of a ball forming position relative to a center of the bonding wire at the time of ball formation.

Further, in the present invention, the bonding wire contains In, and a concentration of in is 0.011% by mass or more relative to the entire wire. With this configuration, the present invention can further improve a bonding longevity of a ball bonded part in a high-temperature and high-humidity environment of a temperature of 130° C. and a relative humidity of 85%.

When forming a ball using a Pd-coated Cu bonding wire containing in and observing a resultant FAB with scanning electron microscope (SEM), many precipitates with a diameter of about a few tens of nanometers were found on a surface of the FAB. From an analysis on the precipitates by energy dispersive X-ray spectroscopy (EDS), it was revealed that in was concentrated. Although a detailed mechanism is unclear, it is considered from the above situation that these precipitates observed on the FAB becomes to be present at the bonding interface of the ball and the electrode, whereby improving a bonding reliability of a ball bonded part in a high-temperature and high-humidity environment of a temperature of 130° C. and a relative humidity of 85%. More preferably, the concentration of In is more preferably 0.031% by mass or more relative to the entire wire. If the concentration of In is 0.031% by mass or more, there can be further improved a bonding longevity of a ball bonded part in a high-temperature and high-humidity environment. Further preferably, the amount of In is 0.100% by mass or more. If the concentration of In is 0.100% by mass or more, there can be still further improved a bonding longevity of a ball bonded part in a high-temperature and high-humidity environment, and thus being able to address a more rigorous requirement for bonding reliability.

A mold resin (an epoxy resin) as a package of a semiconductor device contains chlorine (Cl) in its molecular skeleton. In a high-temperature and high-humidity environment of a temperature of 130° C. and a relative humidity of 85% as a HAST evaluation condition, Cl in the molecular skeleton hydrolyzes and dissolves as a chloride ion ($Cl^-$). In a case where a Cu bonding wire is bonded to an Al electrode, when a Cu/Al bonding interface is placed in high temperature, Cu and Al mutually diffuse, and $Cu_9Al_4$ as an intermetallic compound is finally formed. $Cu_9Al_4$ is susceptible to corrosion by halogen such as Cl and undergoes corrosion by Cl dissolved from the mold resin, leading to degradation in the bonding reliability. In a case where a Cu wire has a Pd coating layer, a bonding interface between the Pd-coated Cu wire and the Al electrode has a structure of Cu/Pd-concentrated layer/Al, whereby a formation of the $Cu_9Al_4$ intermetallic compound is reduced compared with a case of the Cu wire, but it is still insufficient in a bonding reliability in a high-temperature and high-humidity environment required for on-vehicle devices.

In contrast, it is considered that, when a Pd-coated Cu wire contains In as in the present invention, a formation of the $Cu_9Al_4$ inter metallic compound in the bonded part tends to be further reduced. During a formation of FAB of a ball bonded part. In in the wire diffuses also into the Pd coating layer. It is considered that In being present in a Pd-concentrated layer of a Cu/Al interface in the ball bonded part has an effect of reducing mutual diffusion of Cu and Al, resulting in the reduction of formation of $Cu_9Al_4$. In addition, In being contained in the wire may have an effect of directly inhibiting formation of $Cu_9Al_4$.

Although it is preferable that In is present in the Cu core material, a sufficient effect can be obtained even when it is contained in the Pd coating layer or the Au skin layer. A method of adding In into the Cu core material is easy in terms of accurate control of concentration, and improves wire productivity and quality stability. Further, a part of In is contained also in the Pd coating layer or the Au skin layer due to a diffusion through a heat treatment or the like, whereby improving an adhesiveness of interfaces among the layers, and thus being able to further improve a wire productivity.

On the other hand, if the amount of In in wire is excessive and a concentration of In exceeds 1.2% by mass relative to the entire wire, an FAB shape degrades, and moreover, the bonding wire hardens to be insufficient in deformation of a wire bonded part, which causes a problem of degradation in wedge bondability.

In some cases, Cu is present at an outermost surface of the Pd coating layer. If the concentration of Cu is 30 at % or more, there may be a case where the bonding wire is not suitable for practical use because a sulfur resistance of wire surface decreases and a service life of the bonding wire degrades. Consequently, when Cu is present at an outermost surface of the Pd coating layer, the concentration of Cu is preferably less than 30 at %. The outermost surface refers to a region of surface of the bonding wire to be measured by an Auger electron spectroscopic apparatus without performing sputtering or the like.

A mold resin (an epoxy resin) as a package of a semiconductor device contains a silane coupling agent. The silane coupling agent has a function of improving adhesiveness between organic matter (resin) and inorganic matter (silicon or metal) and can thereby improve adhesiveness with a silicon substrate or metal. In a case where a higher adhesiveness is required such as a case of on-vehicle semiconductors that require reliability at higher temperatures, a "sulfur-containing silane coupling agent" is added therein. Sulfur contained in the mold resin is not liberated at about 130° C. as a temperature condition of HAST, but is liberated when being used under a condition of 175° C. to 200° C. or more. When sulfur liberated at a high temperature of 175° C. or more comes in contact with Cu, Cu drastically corrodes to produce a sulfide ($Cu_2S$) or an oxide (CuO). When the corrosion of Cu occurs in a semiconductor device using Cu bonding wire, a bonding reliability, in particular of a ball bonded part, degrades.

As means for evaluating reliability of the ball bonded part in a high-temperature environment at 175° C. or more, there is used a high temperature storage test (HTS) (a high-temperature shelf test). For a sample to be evaluated that has been exposed to a high-temperature environment, a bonding longevity of a ball bonded part is evaluated by measuring temporal changes in a resistance value of the bonded part, or measuring temporal changes in shear strength of the ball bonded part. For on-vehicle semiconductor devices, it is required an improvement in the reliability of the ball bonded part in HTS of 175° C. to 200° C.

In the bonding wire of the present invention, it is preferable that the Cu alloy core material contains at least one element selected from Pt, Pd, Rh and Ni, and a concentration of each of the elements contained in the Cu alloy core material is preferably 0.05 to 1.2% by mass. The Cu alloy core material containing these elements improves performance in HTS of 175° C. or more among the bonding reliability of the ball bonded part in a high temperature environment. If the concentration of each of these components contained in the Cu alloy core material is less than 0.05% by mass, the above effect is not obtained. If the concentration exceeds 1.2% by mass, an FAB shape degrades, and moreover, the bonding wire hardens to be insufficient in deformation of a wire bonded part, which causes a problem of degradation in wedge bondability. Furthermore, by containing the above elements in an amount within the range mentioned above, there can be improved a loop formability, that is, there can be reduced a leaning, which becomes a problem for high-density mounting. This is because a yield strength of a bonding wire increases and a deformation of the bonding wire can be reduced when the Cu alloy core material contains Pt, Pd, Rh or Ni. The concentration of the elements contained in the Cu alloy core material is more preferably 0.1% by mass or more, 0.2% by mass or more, 0.3% by mass or more, or 0.5% by mass or more. The concentration of the elements contained in the Cu alloy core material is more preferably 1% by mass or less or 0.8% by mass or less. Examples of a method for determining a concentration of elements contained in the Cu alloy core material from a bonding wire product include a method that exposes a cross-section of a bonding wire and performs a concentration analysis of a region of the Cu alloy core material, and a method that performs a concentration analysis of a region of the Cu alloy core material while trimming the bonding wire from its surface in a depth direction by sputtering or the like. When the Cu alloy core material contains a region having a concentration gradient of Pd, for example, line analysis may be performed on a cross-section of the bonding wire, and a concentration analysis may be performed on a region that has no concentration gradient of Pd (a region in which a degree of a change in Pd concentration in the depth direction is less than 10 mol % per 0.1 μm, for example). A method of concentration analysis will be described below.

The bonding wire of the present invention may further include an Au skin layer on the Pd coating layer. In the bonding wire of the present invention, the Au skin layer of 0.0005 to 0.050 μm may be further formed on a surface of the Pd coating layer, for example. With this formation, a wedge bondability of the bonding wire can be improved.

The Au skin layer reacts with the Pd coating layer to improve adhesive strength among the Au skin layer, the Pd coating layer and the Cu alloy core material and to prevent the Pd coating layer and the Au skin layer from peeling at the time of wedge bonding. Accordingly, a wedge bondability of the bonding wire can be improved. If a thickness of the Au skin layer is less than 0.0005 μm, the above effect is not obtained. If the thickness exceeds 0.050 μm, an FAB shape becomes eccentric. The thickness of the Au skin layer is preferably 0.0005 μm or more and more preferably 0.001 μm or more, 0.003 μm or more, or 0.005 μm or more. The thickness of the Au skin layer is preferably 0.050 μm or less. The Au skin layer can be formed by a method similar to that of the Pd coating layer.

In some cases, Cu is present at an outermost surface of the Au skin layer. If the concentration of Cu is 35 at % or more, there may be a case where the bonding wire is not suitable for practical use because a sulfur resistance of wire surface decreases and a service life of the bonding wire degrades. Consequently, when Cu is present at an outermost surface of the Au skin layer, the concentration of Cu is preferably less than 35 at %. The outermost surface refers to a region of surface of the bonding wire to be measured by an Auger electron spectroscopic apparatus without performing sputtering or the like.

When the bonding wire further contains at least one element selected from B, P, Mg, Ga and Ge and a concentration of each of the elements is 1 to 100 ppm by mass relative to the entire wire, there can be improved a crushed shape of a ball bonded part required for high-density mounting, that is, there can be improved a circularity of shape of a ball bonded part. This is because an addition of the elements can allow a size of crystal grain in the ball to be fine and can reduce a deformation of the ball. If a concentration of the elements relative to the entire wire is less than 1 ppm by mass, the above effect is not obtained. If the concentration exceeds 100 ppm by mass, it is not suitable for practical use because the ball hardens and chip damage at the time of ball bonding becomes a problem. The concentration of each of the elements relative to the entire wire is more preferably 3 ppm by mass or more or 5 ppm by mass or more. The concentration of each of the elements relative to the entire wire is more preferably 95 ppm by mass or less, 90 ppm by mass or less, 85 ppm by mass or less, or 80 ppm by mass or less.

At interfaces among the Cu alloy core material, the Pd coating layer and the Au skin layer of the bonding wire, alloy layers having a concentration gradient may be formed due to a diffusion of atoms through heat treatment in a manufacturing process. In such a case, a boundary between the Cu alloy core material and the Pd coating layer was determined based on a concentration of Pd. Specifically, the boundary was set to be a position at which a concentration of Pd was 50 at %, and a region in which a concentration of Pd was 50 at % or more was determined to be the Pd coating layer, whereas a region in which a concentration of Pd was less than 50 at % was determined to be the Cu alloy core material. This is because if a concentration of Pd is 50 at % or more, there can be expected an effect of improving characteristics from the structure of the Pd coating layer. A boundary between the Pd coating layer and the Au skin layer was determined based on a concentration of Au. Specifically, the boundary was set to be a position at which a concentration of Au was 10 at %, and a region in which a concentration of Au was 10 at % or more was determined to be the Au skin layer, whereas a region in which a concentration of Au was less than 10 at % was determined to be the Pd coating layer. This is because if a concentration of Au is 10 at % or more, there can be expected an effect of improving characteristics from the structure of the Au skin layer.

For a concentration analysis of the Pd coating layer and the Au skin layer and a concentration analysis of Pt, Pd, Rh and Ni in the Cu alloy core material, a method of performing an analysis while trimming the bonding wire from its surface in the depth direction by sputtering or the like, or a method of exposing a cross-section of the wire and performing a line analysis, a point analysis or the like thereon is effective. For an analyzer used for such concentration analysis, an Auger electron spectroscopic apparatus installed in a scanning electron microscope or a transmission electron microscope, an energy dispersive X-ray analyzer, and an electron probe micro analyzer, etc., can be applied. As a method for exposing a cross-section of wire, a mechanical polishing, an ion etching, etc., can be applied. Trace components such as In, B, P, Mg, Ga and Ge can be detected, as the concentrations of elements contained in the entire bonding wire, using an ICP emission spectrometer or an ICP mass spectrometer.

If a crystal orientation <111> angled at 15 degrees or less to a wire longitudinal direction has a proportion of 30 to 100% in terms of areal percentage among crystal orientations in the wire longitudinal direction on a surface of the bonding wire, there can be improved a loop formability, that is, there can be reduced a leaning, which becomes a problem for high-density mounting. This is because when a surface crystal orientation is aligned, the bonding wire is resistant to lateral deformation and a lateral deformation thereof is reduced, and thus leaning failures can be reduced. Consequently, in an embodiment, in a measurement result when measuring crystal orientations on a surface of the bonding wire, a crystal orientation <111> angled at 15 degrees or less to a longitudinal direction of the bonding wire has a proportion of 30 to 100% in terms of areal percentage. From a view point of reducing leaning failures, the above crystal orientation <111> has a proportion of more preferably 35% or more, and further preferably 40% or more, 45% or more, 50% or more, or 55% or more in terms of areal percentage.

(Manufacturing Method)

Next, there will be described a method for manufacturing the bonding wire according to the embodiment of the present invention. The bonding wire is obtained by manufacturing a Cu alloy used for a core material, working it into a thin wire, forming a Pd coating layer and an Au skin layer, and performing heat treatment. After forming the Pd coating layer and the Au skin layer, another wire drawing and heat treatment may be performed. There will be described in detail a method for manufacturing the Cu alloy core material, a method for forming the Pd coating layer and the Au skin layer, and a method of heat treatment.

The Cu core alloy used for a core material is obtained by melting Cu as a raw material and additive elements together and solidifying them. An arc heating furnace, a high-frequency heating furnace, a resistance heating furnace, or the like can be used for the melting. In order to prevent gases such as $O_2$ and $H_2$ being mixed therein from air, the melting is preferably performed in a vacuum atmosphere or an inert atmosphere such as Ar and $N_2$.

A method for forming the Pd coating layer and the Au skin layer on a surface of the Cu alloy core material includes a plating method, a vapor deposition method, and a melting method. For a plating method, both of an electroplating method and an electroless plating method can be used. The electroplating, called a strike plating or a flash plating, is high in plating speed and is favorable in adhesiveness with a substrate. A solution used for an electroless plating is classified into a substitutional type and a reduction type. Although performing the substitutional type plating alone is sufficient for a smaller thickness, it is effective for a larger thickness to perform the reduction type plating after the substitutional type plating in a step-by-step manner.

For a vapor deposition method, there can be used a physical adsorption such as a sputtering method, an ion plating method and a vacuum vapor deposition, and a chemical adsorption such as plasma CVD. They are all dry processes, and are free from the necessity of cleaning after forming the Pd coating layer and the Au skin layer and from any concern about surface contamination and the like during cleaning.

For a formation of the Pd coating layer and the Au skin layer, both a method of forming them after performing wire drawing to a final diameter of wire and a method of forming them on a Cu alloy core material of large diameter and then performing wire drawing several times until obtaining a target diameter of wire are effective. In the former in which the Pd coating layer and the Au skin layer are formed at the final diameter of wire, a manufacture, a quality control, and the like are simple. In the latter in which the wire drawing is performed in combination with the formed Pd coating layer and Au skin layer, there is the advantage that adhesiveness with the Cu alloy core material improves. Specific examples of the respective formation methods include a method of forming the Pd coating layer and the Au skin layer on a Cu alloy core material with a final diameter while successively sweeping the wire through an electroplating solution and a method of forming the Pd coating layer and the Au skin layer by immersing a Cu alloy core material of large diameter into an electro or electroless plating solution and then drawing the wire to achieve a final diameter of wire.

After forming the Pd coating layer and the Au skin layer, heat treatment may be carried out. By carrying out the heat treatment, diffusion of atoms occurs among the Au skin layer, the Pd coating layer and the Cu alloy core material, which improves adhesive strength therebetween and is effective in that the Au skin layer and the Pd coating layer are prevented from peeling during working, and thus, improving productivity. In order to prevent $O_2$ being mixed therein from air, it is preferable to perform the heat treatment in a vacuum atmosphere or an inert atmosphere such as Ar or $N_2$.

The proportion of the crystal orientation <111> angled at 15 degrees or less to the wire longitudinal, direction among the crystal orientations in the wire longitudinal direction on a surface of the bonding wire can be set to a range of 30 to 100% according to the following method. That is, a working rate after forming the Pd coating layer or after forming the Pd coating layer and the Au skin layer is made large, which allows texture having directivity on a surface of the wire (texture having a crystal orientation aligned to a wire drawing direction) to be developed. Specifically, a working rate after forming the Pd coating layer or after forming the Pd coating layer and the Au skin layer is set to be 90% or more, which allows the proportion of the crystal orientation <111> angled at 15 degrees or less to the wire longitudinal direction among the crystal orientations in the wire longitudinal direction on a surface of the bonding wire to be 30% or more in terms of areal percentage. The working rate is represented by "working rate (%)=(cross-sectional area of wire before working–cross-sectional area of wire after working)/cross-sectional area of wire before working×100."

In order to determine a proportion of the crystal orientation <111> angled at 15 degrees or less to the wire longitudinal direction among the crystal orientations in the wire longitudinal direction on a surface of the bonding wire, an evaluation of crystal structure is conducted with a surface of wire as an observation surface. A method of evaluation thereof includes an electron backscattered diffraction method (EBSD). The EBSD method can be used to observe crystal orientations on an observation surface and graphically shows an angle difference of the crystal orientations between adjacent measurement points. Further, the EBSD method can be used to relatively easily observe the crystal orientations with high accuracy, even for a thin wire like the bonding wire.

The orientation proportion of <111> on surface is determined by calculating the proportion (areal percentage) of the crystal orientation <111> angled at 15 degrees or less to the wire longitudinal direction among the crystal orientations in the wire longitudinal direction with all crystal orientations identified by a dedicated software as a population.

The present invention is not limited to the above embodiment, and appropriate alterations can be made within the scope of the spirit of the present invention.

EXAMPLES

The bonding wire according to an embodiment of the present invention will be described in detail below with reference to examples.

(Sample)

First, there will be described a method for manufacturing a sample. For Cu as a raw material of a core material, Cu with a purity of 99.99% by mass or more and containing inevitable impurities as the remainder was used. For In, Pt, Pd, Rh, Ni, B, P, Mg, Ga and Ge, the ones with a purity of 99% by mass or more and containing inevitable impurities as the remainder were used. In, Pt, Pd, Rh, Ni, B, P, Mg, Ga and Ge as additive elements are mixed so that the core material will have a desired Cu alloy composition. Regarding the addition of In, Pt, Pd, Rh, Ni, B, P, Mg, Ga and Ge, they can be mixed singly. Alternatively, they may be mixed so as to be a desired amount using a Cu master alloy containing the additive elements manufactured in advance if the element has a high melting point as a single body or if the element is added in an infinitesimal amount.

The Cu alloy for the core material was manufactured by charging the raw materials into a carbon crucible worked into a cylindrical shape with a diameter of 3 to 8 mm, heating and melting the raw materials at 1,090 to 1,300° C. in vacuum or in an inert atmosphere such as an $N_2$ or Ar gas using a high-frequency furnace, and performing furnace cooling. The obtained alloy with a diameter of 3 to 8 mm was drawn to manufacture a wire with a diameter of 0.3 to 1.4 mm. A commercially available lubricant was used for the wire drawing, and a wire drawing speed was 20 to 400 m/min. In order to remove an oxide film on a surface of the wire, a pickling treatment with sulfuric acid was performed, and a Pd coating layer was formed by 1 to 15 μm so as to cover the entire surface of the Cu alloy as the core material. Furthermore, for some wires, an Au skin layer was formed by 0.01 to 1.5 μm on the Pd coating layer. For the formation of the Pd coating layer and the Au skin layer, electroplating method was used. A commercially available semiconductor plating solution was used for a plating solution. Heat treatment at 200 to 700° C. and wire drawing were then repeatedly carried out to perform working to a diameter of 20 μm. After working, heat treatment was performed while flowing an $N_2$ or Ar gas so that breaking elongation will finally be about 7 to 15%. A method of heat treatment was carried out while successively sweeping the wire and was carried out while flowing an $N_2$ or Ar gas. A wire feeding speed was 10 to 200 m/min, a heat treatment temperature was 200 to 700° C., and a heat treatment time was 0.05 to 1.5 seconds.

By adjusting the working rate after forming the Pd coating layer or after forming the Pd coating layer and the Au skin layer, the proportion (areal percentage) of the crystal orientation <111> angled at 15 degrees or less to the wire longitudinal direction among the crystal orientations in the wire longitudinal direction on a surface of the bonding wire was adjusted.

In, B, P, Mg, Ga and Ge were analyzed as the concentrations of the elements contained in the entire bonding wire using an ICP emission spectrometer.

For a concentration analysis of the Pd coating layer and the Au skin layer and a concentration analysis of Pt, Pd, Rh and Ni in the Cu alloy core material, an Auger electron spectrometry was performed while trimming the bonding wire from its surface in the depth direction by sputtering or the like. From an obtained concentration profile in the depth direction, there were determined thickness of the Pd coating layer, a thickness of the Au skin layer, and concentrations of Pt, Pd, Rh and Ni in the Cu alloy core material.

The configurations of the respective samples manufactured according to the above procedure are listed in Table 1. In Table 1, items out of the range of the present invention are attached with underlines.

(Method of Evaluation)

A crystal structure was evaluated with a surface of wire as an observation surface. An electron backscattered diffraction method (EBSD) was used as a method of evaluation. The EBSD method is characterized in that it can observe crystal orientations on an observation surface and graphically shows an angle difference of the crystal orientations between adjacent measurement points. The EBSD method can relatively easily observe the crystal orientations with high accuracy, even for a thin wire like the bonding wire.

Care should be taken when performing EBSD method with a curved surface like the wire surface as a subject. When a region with a large curvature is measured, measurement with high accuracy is difficult. However, a bonding wire to be measured is fixed to a line on a plane, and a flat part near the center of the bonding wire is measured, whereby measurement with high accuracy can be performed. Specifically, the following measurement region will work well. The size in the circumferential direction is 50% or less of the wire diameter with a center in the wire longitudinal direction as an axis, and the size in the wire longitudinal direction is 100 μm or less. Preferably, the size in the circumferential direction is 40% or less of the wire diameter, and the size in the wire longitudinal direction is 40 μm or less, whereby measurement efficiency can be improved by reducing a measurement time. In order to further improve accuracy, it is desirable that three or more points are measured to obtain average information with variations taken into account. The measurement sites may be apart from each other by 1 mm or more so as not to be close to each other.

The orientation proportion of <111> on surface was determined by calculating the proportion (areal percentage) of the crystal orientation <111> angled at 15 degrees or less to the wire longitudinal direction among the crystal orientations in the wire longitudinal direction with all crystal orientation identified by a dedicated software as a population.

The bonding reliability of the ball bonded part in a high-temperature and high humidity environment or a high-temperature environment was determined by manufacturing a sample for bonding reliability evaluation, performing MAST and HTS evaluation, and by evaluating the bonding longevity of the ball bonded part in each test. The sample for bonding reliability evaluation was manufactured by performing ball bonding onto an electrode, which has been formed by forming an alloy of Al-1.0% Si-0.5% Cu as a film with a thickness of 0.8 μm on a Si substrate on a general metallic frame, using a commercially available wire bonder and sealing it with a commercially available mold resin. A ball was formed while flowing an $N_2$+5% $H_2$ gas at a flow rate of 0.4 to 0.6 L/min, and its size was a diameter of 34 μm.

For the MAST evaluation, the manufactured sample for bonding reliability evaluation was exposed to a high-temperature and high-humidity environment of a temperature of 130° C. and a relative humidity of 85% using an unsaturated type pressure cooker tester and was biased with 5 V. A shear test on the ball bonded part was performed every 48 hours, and a time until a value of shear strength became half of the initial shear strength was determined to be the bonding longevity of the ball bonded part. The shear test after the high-temperature and high-humidity test was carried out after removing a resin by acid treatment and exposing the ball bonded part.

A tester manufactured by DAGE was used for a shear tester for the HAST evaluation. An average value of measurement values on 10 ball bonded parts randomly selected was used for the value of the shear strength. In the above evaluation, the bonding longevity being less than 96 hours was determined to be practically problematic to be marked with a symbol of "cross," being 96 to 144 hours was determined to be practicable but somewhat problematic to be marked with a symbol of "triangle," being 144 to 288 hours was determined to be practically no problem to be marked with a symbol of "circle," and being 288 hours or more was determined to be excellent to be marked with a symbol of "double circle" in the column "HAST" in Table 1.

For the HTS evaluation, the manufactured sample for bonding reliability evaluation was exposed to a high-temperature environment of a temperature of 200° C. using a high-temperature thermostatic device. A shear test on the ball bonded part was performed every 500 hours, and a time until a value of shear strength became half of the initial shear strength was determined to be the bonding longevity of the ball bonded part. The shear test after the high-temperature and high-humidity test was performed after removing a resin by acid treatment and exposing the ball bonded part.

A tester manufactured by DAGE was used for a shear tester for the HTS evaluation. An average value of measurement values on 10 ball bonded parts randomly selected was used for the value of the shear strength. In the above evaluation, the bonding longevity being 500 to 1,000 hours was determined to be practicable but be desired to be improved to be marked with a symbol of "triangle," being 1,000 to 3,000 hours was determined to be practically no problem to be marked with a symbol of "circle," and being 3,000 hours or more was determined to be especially excellent to be marked with a symbol of "double circle."

For the evaluation of ball formability (FAB shape), a ball before performing bonding was collected and observed, and the presence or absence of voids on a surface of the ball and the presence or absence of deformation of the ball, which is primarily a perfect sphere. The occurrence of any of the above was determined to be faulty. The formation of the ball was performed while an $N_2$ gas was blown at a flow rate of 0.5 L/min in order to reduce oxidation in a melting process. The size of the ball was 34 μm. For one condition, 50 balls were observed. A SEM was used for the observation. In the evaluation of the ball formability, a case where five or more failures occurred was determined to be problematic to be marked with a symbol of "cross," a case of three or four failures was determined to be practicable but somewhat problematic to be marked with a symbol of "triangle," a case of one or two failures was determined to be no problem to be marked with a symbol of "circle," and a case where no failure occurred was determined to be excellent to be marked with a symbol of "double circle in the column "FAB shape" in Table 1.

The evaluation of wedge bondability on the wire bonded part was determined by performing 1,000 pieces of bonding on leads of a lead frame and evaluating by the occurrence frequency of peeling of the bonded part. An Fe-42 wt % Ni alloy lead frame plated with 1 to 3 μm Ag was used for the lead frame. In this evaluation, assuming more rigorous bonding conditions than normal, a stage temperature was set to be 150° C., which was lower than a generally set temperature range. In the above evaluation, a case where 11 or more failures occurred was determined to be problematic to be marked with a symbol of "cross," a case of 6 to 10 failures was determined to be practicable but somewhat problematic to be marked with a symbol of "triangle," a case of 1 to 5 failures was determined to be no problem to be marked with a symbol of "circle," and a case where no failure occurred was determined to be excellent to be marked with a symbol of "double circle" in the column "wedge bondability" in Table 1.

The evaluation of a crushed shape of the ball bonded part was determined by observing the ball bonded part from immediately above after bonding and evaluating by its circularity. For an object to be bonded with the bonding wire, an electrode in which an Al-0.5 wt % Cu alloy was formed as a film with a thickness of 1.0 μm on a Si substrate was used. The observation was performed using an optical microscope, and 200 sites were observed for one condition. Being elliptic with large deviation from a perfect circle and being anisotropic in deformation were determined to be faulty in the crushed shape of the ball bonded part. In the above evaluation, a case where six or more failures occurred was determined to be problematic to be marked with a symbol of "cross," a case of four or five failures was determined to be practicable but somewhat problematic to be marked with a symbol of "triangle," being one to three was determined to be no problem to be marked with a symbol of "circle," and a case where a favorable perfect circle was obtained for all was determined to be especially excellent to be marked with a symbol of "double circle" in the column "crushed shape" in Table 1.

[Leaning]

To a lead frame for evaluation, 100 pieces of bonding were performed with a loop length of 5 mm and a loop height of 0.5 mm. As a method of evaluation, a wire upright part was observed from a chip horizontal direction, and evaluation was performed based on spacing when spacing between a perpendicular line passing through the center of the ball bonded part and the wire upright part was maximized (leaning spacing). If the leaning spacing was smaller than the wire diameter, leaning was determined to be favorable, whereas if the leaning spacing was larger, the upright part leaned, and the leaning was determined to be faulty. One hundred bonded wires were observed with an optical microscope, and the number of leaning failures was counted. A case where seven or more failures occurred was determined to be problematic to be marked with a symbol of "cross," a case of four to six failures was determined to be practicable but somewhat problematic to be marked with a symbol of "triangle," a case of one to three failures was determined to be no problem to be marked with a symbol of "circle," and a case where no failure occurred was determined to be excellent to be marked with a symbol of "double circle" in the column "leaning" in Table 1.

TABLE 1

| | | Component amount (% by mass) | | | | | Component amount (ppm by mass) | | | | |
| | | Concentration in wire | Concentration in core material | | | | Concentration in wire | | | | |
| | Test No. | In | Pd | Pt | Ni | Rh | B | P | Mg | Ga | Ge |
|---|---|---|---|---|---|---|---|---|---|---|---|
| Working Example | 1 | 0.011 | — | — | — | — | — | — | — | — | — |
| | 2 | 0.011 | — | — | — | — | — | — | — | — | — |
| | 3 | 0.011 | — | — | — | — | — | — | — | — | — |
| | 4 | 0.011 | — | — | — | — | — | — | — | — | — |
| | 5 | 0.011 | — | — | — | — | — | — | — | — | — |
| | 6 | 0.011 | — | — | — | — | — | — | — | — | — |
| | 7 | 0.011 | — | — | — | — | — | — | — | — | — |
| | 8 | 0.011 | — | — | — | — | — | — | — | — | — |
| | 9 | 0.011 | — | — | — | — | — | — | — | — | — |
| | 10 | 0.030 | — | — | — | — | — | — | — | — | — |
| | 11 | 0.030 | — | — | — | — | — | — | — | — | — |
| | 12 | 0.031 | — | — | — | — | — | — | — | — | — |
| | 13 | 0.031 | — | — | — | — | — | — | — | — | — |
| | 14 | 0.100 | — | — | — | — | — | — | — | — | — |
| | 15 | 0.100 | — | — | — | — | — | — | — | — | — |
| | 16 | 0.100 | — | — | — | — | — | — | — | — | — |
| | 17 | 0.100 | — | — | — | — | — | — | — | — | — |
| | 18 | 0.100 | — | — | — | — | — | — | — | — | — |
| | 19 | 0.250 | — | — | — | — | — | — | — | — | — |
| | 20 | 0.250 | — | — | — | — | — | — | — | — | — |
| | 21 | 0.500 | — | — | — | — | — | — | — | — | — |
| | 22 | 0.500 | — | — | — | — | — | — | — | — | — |
| | 23 | 1.200 | — | — | — | — | — | — | — | — | — |
| | 24 | 1.200 | — | — | — | — | — | — | — | — | — |
| | 25 | 0.011 | 0.05 | — | — | — | — | — | — | — | — |
| | 26 | 0.011 | 0.70 | — | — | — | — | — | — | — | — |
| | 27 | 0.011 | 1.20 | — | — | — | — | — | — | — | — |
| | 28 | 0.011 | — | 0.05 | — | — | — | — | — | — | — |
| | 29 | 0.011 | — | 0.70 | — | — | — | — | — | — | — |
| | 30 | 0.011 | — | 1.20 | — | — | — | — | — | — | — |
| | 31 | 0.011 | — | — | 0.05 | — | — | — | — | — | — |
| | 32 | 0.011 | — | — | 0.70 | — | — | — | — | — | — |
| | 33 | 0.011 | — | — | 1.20 | — | — | — | — | — | — |
| | 34 | 0.011 | — | — | — | 0.05 | — | — | — | — | — |
| | 35 | 0.011 | — | — | — | 0.70 | — | — | — | — | — |
| | 36 | 0.011 | — | — | — | 1.20 | — | — | — | — | — |
| | 37 | 0.011 | — | — | — | — | 5 | — | — | — | — |
| | 38 | 0.011 | — | — | — | — | 100 | — | — | — | — |
| | 39 | 0.011 | — | — | — | — | — | 5 | — | — | — |
| | 40 | 0.011 | — | — | — | — | — | 100 | — | — | — |
| | 41 | 0.011 | — | — | — | — | — | — | 5 | — | — |
| | 42 | 0.011 | — | — | — | — | — | — | 100 | — | — |
| | 43 | 0.011 | — | — | — | — | — | — | — | 5 | — |
| | 44 | 0.011 | — | — | — | — | — | — | — | 100 | — |
| | 45 | 0.011 | — | — | — | — | — | — | — | — | 5 |
| | 46 | 0.011 | — | — | — | — | — | — | — | — | 100 |
| | 47 | 0.100 | 0.3 | — | — | — | — | — | — | — | — |
| | 48 | 0.100 | 0.8 | — | — | — | — | — | — | — | — |
| | 49 | 0.100 | 1.2 | — | — | — | — | — | — | — | — |
| | 50 | 0.100 | — | 0.3 | — | — | — | — | — | — | — |
| | 51 | 0.100 | — | 0.8 | — | — | — | — | — | — | — |

TABLE 1-continued

|  | | | | | | | | | | | |
|---|---|---|---|---|---|---|---|---|---|---|---|
| | 52 | 0.100 | — | 1.2 | — | — | — | — | — | — | — |
| | 53 | 0.100 | — | — | 0.3 | — | — | — | — | — | — |
| | 54 | 0.100 | — | — | 0.8 | — | — | — | — | — | — |
| | 55 | 0.100 | — | — | 1.2 | — | — | — | — | — | — |
| | 56 | 0.100 | — | — | — | 0.3 | — | — | — | — | — |
| | 57 | 0.100 | — | — | — | 0.8 | — | — | — | — | — |
| | 58 | 0.100 | — | — | — | 1.2 | — | — | — | — | — |
| | 59 | 0.100 | 0.3 | — | — | — | 3 | — | — | — | — |
| | 60 | 0.100 | 0.3 | — | — | — | 100 | — | — | — | — |
| | 61 | 0.100 | 0.8 | — | — | — | 4 | — | — | — | — |
| | 62 | 0.100 | 0.8 | — | — | — | 100 | — | — | — | — |
| | 63 | 0.100 | 1.2 | — | — | — | 3 | — | — | — | — |
| | 64 | 0.100 | 1.2 | — | — | — | 100 | — | — | — | — |
| | 65 | 0.100 | — | 0.8 | — | — | 10 | — | — | — | — |
| | 66 | 0.100 | — | 0.8 | — | — | 50 | — | — | — | — |
| | 67 | 0.100 | — | — | 0.3 | — | — | 20 | — | — | — |
| | 68 | 0.100 | — | — | 0.3 | — | — | 70 | — | — | — |
| | 69 | 0.100 | — | — | 0.7 | — | — | 30 | — | — | — |
| | 70 | 0.100 | — | — | 0.7 | — | — | 80 | — | — | — |
| | 71 | 0.100 | — | — | 1.2 | — | — | 40 | — | — | — |
| | 72 | 0.100 | — | — | 1.2 | — | — | 90 | — | — | — |
| | 73 | 0.100 | — | — | — | 0.3 | — | 30 | — | — | — |
| | 74 | 0.100 | — | — | — | 1.2 | — | 100 | — | — | — |
| | 75 | 0.100 | — | — | — | — | — | — | 5 | — | — |
| | 76 | 0.100 | — | — | — | — | — | — | 100 | — | — |
| | 77 | 0.100 | — | — | — | — | — | — | — | 5 | — |
| | 78 | 0.100 | — | — | — | — | — | — | — | 100 | — |
| | 79 | 0.100 | — | — | — | — | — | — | — | — | 5 |
| | 80 | 0.100 | — | — | — | — | — | — | — | — | 100 |
| | 81 | 0.500 | 0.7 | — | — | — | 12 | — | — | — | — |
| | 82 | 0.500 | — | 0.7 | — | — | 12 | — | — | — | — |
| | 83 | 0.500 | — | — | 0.7 | — | 12 | — | — | — | — |
| | 84 | 0.500 | — | — | — | 0.7 | 12 | — | — | — | — |
| | 85 | 0.500 | 0.7 | — | — | — | — | 70 | — | — | — |
| | 86 | 0.500 | — | 0.7 | — | — | — | 70 | — | — | — |
| | 87 | 0.500 | — | — | 0.7 | — | — | 70 | — | — | — |
| | 88 | 0.500 | — | — | — | 0.7 | — | 70 | — | — | — |
| | 89 | 0.500 | 0.7 | — | — | — | — | — | 20 | — | — |
| | 90 | 0.500 | — | 0.7 | — | — | — | — | 20 | — | — |
| | 91 | 0.500 | — | — | 0.7 | — | — | — | 20 | — | — |
| | 92 | 0.500 | — | — | — | 0.7 | — | — | 20 | — | — |
| | 93 | 0.500 | 0.7 | — | — | — | — | — | — | 30 | — |
| | 94 | 0.500 | — | 0.7 | — | — | — | — | — | 30 | — |
| | 95 | 0.500 | — | — | 0.7 | — | — | — | — | 30 | — |
| | 96 | 0.500 | — | — | — | 0.7 | — | — | — | 30 | — |
| | 97 | 0.500 | 0.7 | — | — | — | — | — | — | — | 20 |
| | 98 | 0.500 | — | 0.7 | — | — | — | — | — | — | 20 |
| | 99 | 0.500 | — | — | 0.7 | — | — | — | — | — | 20 |
| | 100 | 0.500 | — | — | — | 0.7 | — | — | — | — | 20 |
| | 101 | 1.200 | 0.5 | — | 0.3 | — | 30 | — | — | — | — |
| | 102 | 1.200 | 0.5 | — | 0.7 | — | 75 | — | — | — | — |
| | 103 | 1.200 | 0.5 | — | 1.2 | — | 100 | — | — | — | — |
| | 104 | 1.200 | — | 0.5 | — | 0.3 | 3 | — | — | — | — |
| | 105 | 1.200 | — | 0.5 | — | 0.8 | 5 | — | — | — | — |
| | 106 | 1.200 | — | 0.5 | — | 1.2 | 7 | — | — | — | — |
| | 107 | 1.200 | 0.1 | — | — | — | — | — | — | — | — |
| | 108 | 1.200 | 1.2 | — | — | — | — | — | 10 | — | — |
| | 109 | 1.200 | — | 1.2 | — | — | — | — | — | 10 | — |
| | 110 | 1.200 | — | — | 1.2 | — | — | — | — | — | — |
| | 111 | 1.200 | — | — | — | 1.2 | — | — | — | — | 10 |
| Comparative | 1 | 0.001 | — | — | — | — | — | — | — | — | — |
| Example | 2 | 0.001 | — | — | — | — | — | — | — | — | — |
| | 3 | 0.001 | — | — | — | — | — | — | — | — | — |
| | 4 | 1.500 | — | — | — | — | — | — | — | — | — |
| | 5 | 1.500 | — | — | — | — | — | — | — | — | — |
| | 6 | 1.500 | — | — | — | — | — | — | — | — | — |
| | 7 | 0.010 | — | — | — | — | — | — | — | — | — |
| | 8 | 0.010 | — | — | — | — | — | — | — | — | — |
| | 9 | 0.010 | — | — | — | — | — | — | — | — | — |
| | 10 | 1.300 | — | — | — | — | — | — | — | — | — |
| | 11 | 1.300 | — | — | — | — | — | — | — | — | — |
| | 12 | 1.300 | — | — | — | — | — | — | — | — | — |

TABLE 1-continued

| | | Wire characteristics | | | | | | | |
| | | Film thickness of Pd coating layer (μm) | Film thickness of Au alloy layer (μm) | Surface crystal orientation <111> (%) | Quality evaluation results | | | | |
| | Test No. | | | | HAST | HTS | FAB shape | Wedge bondability | Crushed shape | Leaning |
|---|---|---|---|---|---|---|---|---|---|---|
| Working Example | 1 | 0.015 | — | 32 | △ | △ | ○ | △ | ○ | ○ |
| | 2 | 0.05 | 0.0005 | 60 | △ | △ | ◎ | ○ | ○ | ◎ |
| | 3 | 0.1 | 0.001 | 95 | △ | △ | ◎ | ◎ | ○ | ◎ |
| | 4 | 0.15 | 0.003 | 30 | △ | △ | ○ | ◎ | ○ | ○ |
| | 5 | 0.015 | 0.01 | 58 | △ | △ | ○ | ◎ | ○ | ◎ |
| | 6 | 0.05 | 0.05 | 92 | △ | △ | ◎ | ◎ | ○ | ◎ |
| | 7 | 0.1 | 0.07 | 31 | △ | △ | △ | ◎ | ○ | ○ |
| | 8 | 0.15 | — | 62 | △ | △ | ○ | △ | ○ | ◎ |
| | 9 | 0.015 | 0.0005 | 97 | △ | △ | ○ | ○ | ○ | ◎ |
| | 10 | 0.05 | 0.001 | 32 | △ | △ | ◎ | ◎ | ○ | ○ |
| | 11 | 0.1 | 0.003 | 64 | △ | △ | ◎ | ◎ | ○ | ◎ |
| | 12 | 0.15 | 0.01 | 90 | ○ | △ | ○ | ◎ | ○ | ◎ |
| | 13 | 0.015 | 0.05 | 33 | ○ | △ | ○ | ◎ | ○ | ○ |
| | 14 | 0.05 | 0.07 | 64 | ◎ | △ | △ | ◎ | ○ | ◎ |
| | 15 | 0.1 | — | 95 | ◎ | △ | ◎ | △ | ○ | ◎ |
| | 16 | 0.15 | 0.0005 | 31 | ◎ | △ | ○ | ○ | ○ | ○ |
| | 17 | 0.015 | 0.001 | 59 | ◎ | △ | ○ | ◎ | ○ | ◎ |
| | 18 | 0.05 | 0.003 | 90 | ◎ | △ | ◎ | ◎ | ○ | ◎ |
| | 19 | 0.1 | 0.01 | 32 | ◎ | △ | ◎ | ◎ | ○ | ○ |
| | 20 | 0.15 | 0.05 | 60 | ◎ | △ | ○ | ◎ | ○ | ◎ |
| | 21 | 0.015 | 0.07 | 90 | ◎ | △ | △ | ◎ | ○ | ◎ |
| | 22 | 0.05 | — | 32 | ◎ | △ | ◎ | △ | ○ | ○ |
| | 23 | 0.1 | 0.0005 | 57 | ◎ | △ | △ | △ | ○ | ◎ |
| | 24 | 0.15 | 0.001 | 99 | ◎ | △ | △ | △ | ○ | ◎ |
| | 25 | 0.015 | 0.0005 | 36 | △ | ○ | ○ | ○ | ○ | ◎ |
| | 26 | 0.05 | 0.001 | 67 | △ | ○ | ◎ | ◎ | ○ | ◎ |
| | 27 | 0.1 | 0.003 | 91 | △ | ◎ | ◎ | ◎ | ○ | ◎ |
| | 28 | 0.15 | 0.01 | 30 | △ | ○ | ○ | ◎ | ○ | ◎ |
| | 29 | 0.015 | 0.05 | 57 | △ | ○ | ○ | ◎ | ○ | ◎ |
| | 30 | 0.05 | 0.0005 | 89 | △ | ◎ | ◎ | ○ | ○ | ◎ |
| | 31 | 0.1 | 0.001 | 35 | △ | ◎ | ◎ | ◎ | ○ | ◎ |
| | 32 | 0.15 | 0.003 | 59 | △ | ◎ | ○ | ◎ | ○ | ◎ |
| | 33 | 0.015 | 0.01 | 95 | △ | ◎ | ○ | ◎ | ○ | ◎ |
| | 34 | 0.05 | 0.05 | 33 | △ | ○ | ◎ | ◎ | ○ | ◎ |
| | 35 | 0.1 | 0.0005 | 59 | △ | ○ | ◎ | ◎ | ○ | ◎ |
| | 36 | 0.15 | 0.001 | 96 | △ | ◎ | ○ | ◎ | ○ | ◎ |
| | 37 | 0.015 | 0.003 | 33 | △ | △ | ○ | ◎ | ◎ | ◎ |
| | 38 | 0.05 | 0.01 | 63 | △ | △ | ◎ | ◎ | ◎ | ◎ |
| | 39 | 0.1 | 0.05 | 92 | △ | △ | ◎ | ◎ | ◎ | ◎ |
| | 40 | 0.15 | 0.0005 | 31 | △ | △ | ○ | ○ | ◎ | ◎ |
| | 41 | 0.015 | 0.001 | 64 | △ | △ | ○ | ◎ | ◎ | ◎ |
| | 42 | 0.05 | 0.003 | 89 | △ | △ | ◎ | ◎ | ◎ | ◎ |
| | 43 | 0.1 | 0.01 | 33 | △ | △ | ◎ | ◎ | ◎ | ◎ |
| | 44 | 0.15 | 0.05 | 60 | △ | △ | ○ | ◎ | ◎ | ◎ |
| | 45 | 0.015 | 0.0005 | 90 | △ | △ | ○ | ○ | ◎ | ◎ |
| | 46 | 0.05 | 0.001 | 33 | △ | △ | ◎ | ◎ | ◎ | ◎ |
| | 47 | 0.1 | 0.003 | 62 | ◎ | ○ | ◎ | ◎ | ○ | ◎ |
| | 48 | 0.15 | 0.01 | 98 | ◎ | ○ | ○ | ◎ | ○ | ◎ |
| | 49 | 0.015 | 0.05 | 31 | ◎ | ○ | ○ | ◎ | ○ | ◎ |
| | 50 | 0.05 | 0.0005 | 60 | ◎ | ○ | ◎ | ○ | ○ | ◎ |
| | 51 | 0.1 | 0.001 | 93 | ◎ | ○ | ◎ | ◎ | ○ | ◎ |
| | 52 | 0.15 | 0.003 | 33 | ◎ | ○ | ○ | ◎ | ○ | ◎ |
| | 53 | 0.015 | 0.01 | 59 | ◎ | ○ | ○ | ◎ | ○ | ◎ |
| | 54 | 0.05 | 0.05 | 90 | ◎ | ◎ | ◎ | ◎ | ○ | ◎ |
| | 55 | 0.1 | 0.0005 | 33 | ◎ | ◎ | ◎ | ◎ | ○ | ◎ |
| | 56 | 0.15 | 0.001 | 62 | ◎ | ○ | ○ | ◎ | ○ | ◎ |
| | 57 | 0.015 | 0.003 | 92 | ◎ | ○ | ○ | ◎ | ○ | ◎ |
| | 58 | 0.05 | 0.01 | 32 | ◎ | ○ | ◎ | ◎ | ○ | ◎ |
| | 59 | 0.1 | 0.05 | 62 | ◎ | ○ | ◎ | ◎ | ◎ | ◎ |
| | 60 | 0.15 | 0.0005 | 90 | ◎ | ○ | ○ | ○ | ◎ | ◎ |
| | 61 | 0.015 | 0.001 | 32 | ◎ | ○ | ○ | ◎ | ◎ | ◎ |
| | 62 | 0.05 | 0.003 | 60 | ◎ | ○ | ◎ | ◎ | ◎ | ◎ |
| | 63 | 0.1 | 0.01 | 94 | ◎ | ○ | ○ | ◎ | ◎ | ◎ |
| | 64 | 0.15 | 0.05 | 33 | ◎ | ○ | ○ | ◎ | ◎ | ◎ |
| | 65 | 0.015 | 0.0005 | 64 | ◎ | ○ | ○ | ◎ | ◎ | ◎ |
| | 66 | 0.05 | 0.001 | 92 | ◎ | ○ | ◎ | ◎ | ◎ | ◎ |
| | 67 | 0.1 | 0.003 | 30 | ◎ | ○ | ○ | ◎ | ◎ | ◎ |
| | 68 | 0.15 | 0.01 | 60 | ◎ | ○ | ○ | ◎ | ◎ | ◎ |
| | 69 | 0.015 | 0.05 | 95 | ◎ | ◎ | ○ | ◎ | ◎ | ◎ |
| | 70 | 0.05 | 0.0005 | 32 | ◎ | ◎ | ◎ | ○ | ◎ | ◎ |

TABLE 1-continued

|  | # | c1 | c2 | c3 | s1 | s2 | s3 | s4 | s5 | s6 | s7 |
|---|---|---|---|---|---|---|---|---|---|---|---|
|  | 71 | 0.1 | 0.001 | 62 | ⊚ | ⊚ | ⊚ | ⊚ | ⊚ | ⊚ | ⊚ |
|  | 72 | 0.15 | 0.003 | 92 | ⊚ | ⊚ | ○ | ⊚ | ⊚ | ⊚ | ⊚ |
|  | 73 | 0.015 | 0.01 | 32 | ⊚ | ⊚ | ○ | ⊚ | ⊚ | ⊚ | ⊚ |
|  | 74 | 0.05 | 0.05 | 54 | ⊚ | ⊚ | ⊚ | ⊚ | ⊚ | ⊚ | ⊚ |
|  | 75 | 0.1 | 0.0005 | 97 | ⊚ | △ | ⊚ | ○ | ⊚ | ⊚ | ⊚ |
|  | 76 | 0.15 | 0.001 | 33 | ⊚ | △ | ○ | ⊚ | ⊚ | ⊚ | ○ |
|  | 77 | 0.015 | 0.003 | 57 | ⊚ | △ | ○ | ⊚ | ⊚ | ⊚ | ⊚ |
|  | 78 | 0.05 | 0.01 | 87 | ⊚ | △ | ⊚ | ⊚ | ⊚ | ⊚ | ⊚ |
|  | 79 | 0.1 | 0.05 | 31 | ⊚ | △ | ⊚ | ⊚ | ⊚ | ⊚ | ○ |
|  | 80 | 0.15 | 0.0005 | 63 | ⊚ | △ | ○ | ○ | ⊚ | ⊚ | ⊚ |
|  | 81 | 0.015 | 0.001 | 96 | ⊚ | ⊚ | ○ | ⊚ | ⊚ | ⊚ | ⊚ |
|  | 82 | 0.05 | 0.003 | 33 | ⊚ | ⊚ | ⊚ | ⊚ | ⊚ | ⊚ | ⊚ |
|  | 83 | 0.1 | 0.01 | 58 | ⊚ | ⊚ | ⊚ | ⊚ | ⊚ | ⊚ | ⊚ |
|  | 84 | 0.15 | 0.05 | 90 | ⊚ | ⊚ | ○ | ⊚ | ⊚ | ⊚ | ⊚ |
|  | 85 | 0.015 | 0.0005 | 30 | ⊚ | ⊚ | ○ | ○ | ⊚ | ⊚ | ⊚ |
|  | 86 | 0.05 | 0.001 | 66 | ⊚ | ⊚ | ⊚ | ⊚ | ⊚ | ⊚ | ⊚ |
|  | 87 | 0.1 | 0.003 | 32 | ⊚ | ⊚ | ⊚ | ⊚ | ⊚ | ⊚ | ⊚ |
|  | 88 | 0.15 | 0.01 | 91 | ⊚ | ⊚ | ○ | ⊚ | ⊚ | ⊚ | ⊚ |
|  | 89 | 0.015 | 0.05 | 31 | ⊚ | ⊚ | ○ | ⊚ | ⊚ | ⊚ | ⊚ |
|  | 90 | 0.05 | 0.0005 | 62 | ⊚ | ⊚ | ⊚ | ○ | ⊚ | ⊚ | ⊚ |
|  | 91 | 0.1 | 0.001 | 93 | ⊚ | ⊚ | ⊚ | ⊚ | ⊚ | ⊚ | ⊚ |
|  | 92 | 0.15 | 0.003 | 33 | ⊚ | ⊚ | ○ | ⊚ | ⊚ | ⊚ | ⊚ |
|  | 93 | 0.015 | 0.01 | 63 | ⊚ | ⊚ | ○ | ⊚ | ⊚ | ⊚ | ⊚ |
|  | 94 | 0.05 | 0.05 | 99 | ⊚ | ⊚ | ⊚ | ⊚ | ⊚ | ⊚ | ⊚ |
|  | 95 | 0.1 | 0.0005 | 33 | ⊚ | ⊚ | ⊚ | ○ | ⊚ | ⊚ | ⊚ |
|  | 96 | 0.15 | 0.001 | 65 | ⊚ | ⊚ | ○ | ⊚ | ⊚ | ⊚ | ⊚ |
|  | 97 | 0.015 | 0.003 | 94 | ⊚ | ⊚ | ○ | ⊚ | ⊚ | ⊚ | ⊚ |
|  | 98 | 0.05 | 0.01 | 32 | ⊚ | ⊚ | ⊚ | ⊚ | ⊚ | ⊚ | ⊚ |
|  | 99 | 0.1 | 0.05 | 59 | ⊚ | ⊚ | ⊚ | ⊚ | ⊚ | ⊚ | ⊚ |
|  | 100 | 0.15 | 0.0005 | 94 | ⊚ | ⊚ | ○ | ○ | ⊚ | ⊚ | ⊚ |
|  | 101 | 0.015 | 0.001 | 34 | ⊚ | ⊚ | △ | △ | ⊚ | ⊚ | ⊚ |
|  | 102 | 0.05 | 0.003 | 61 | ⊚ | ⊚ | △ | △ | ⊚ | ⊚ | ⊚ |
|  | 103 | 0.1 | 0.01 | 92 | ⊚ | ⊚ | △ | △ | ⊚ | ⊚ | ⊚ |
|  | 104 | 0.15 | 0.05 | 31 | ⊚ | ⊚ | △ | △ | ⊚ | ⊚ | ⊚ |
|  | 105 | 0.015 | 0.0005 | 63 | ⊚ | ⊚ | △ | △ | ⊚ | ⊚ | ⊚ |
|  | 106 | 0.05 | 0.001 | 95 | ⊚ | ⊚ | △ | △ | ⊚ | ⊚ | ⊚ |
|  | 107 | 0.1 | 0.003 | 30 | ⊚ | ⊚ | △ | △ | ○ | ⊚ | ⊚ |
|  | 108 | 0.15 | 0.01 | 62 | ⊚ | ⊚ | △ | △ | ⊚ | ⊚ | ⊚ |
|  | 109 | 0.015 | 0.05 | 91 | ⊚ | ⊚ | △ | △ | ⊚ | ⊚ | ⊚ |
|  | 110 | 0.05 | 0.0005 | 32 | ⊚ | ⊚ | △ | △ | ○ | ⊚ | ⊚ |
|  | 111 | 0.1 | 0.001 | 65 | ⊚ | ⊚ | △ | △ | ⊚ | ⊚ | ⊚ |
| Comparative Example | 1 | 0.006 | 0.001 | 21 | X | △ | X | ⊚ | ○ | ⊚ | △ |
|  | 2 | 0.1 | 0.003 | 32 | X | △ | ⊚ | ⊚ | ⊚ | ○ | ○ |
|  | 3 | 0.2 | 0.01 | 19 | X | △ | X | ⊚ | ○ | ⊚ | △ |
|  | 4 | 0.05 | 0.001 | 60 | ⊚ | △ | X | X | ⊚ | ○ | ⊚ |
|  | 5 | 0.1 | 0.003 | 28 | ⊚ | △ | X | X | ⊚ | ○ | △ |
|  | 6 | 0.15 | 0.01 | 94 | ⊚ | △ | X | X | ⊚ | ○ | ⊚ |
|  | 7 | 0.006 | 0.001 | 21 | X | △ | X | ⊚ | ○ | ⊚ | △ |
|  | 8 | 0.1 | 0.003 | 31 | X | △ | ⊚ | ⊚ | ⊚ | ○ | ○ |
|  | 9 | 0.2 | 0.01 | 29 | X | △ | X | ⊚ | ⊚ | ○ | △ |
|  | 10 | 0.05 | 0.001 | 62 | ⊚ | △ | X | X | ⊚ | ○ | ⊚ |
|  | 11 | 0.1 | 0.003 | 10 | ⊚ | △ | X | X | ⊚ | ○ | △ |
|  | 12 | 0.15 | 0.01 | 94 | ⊚ | △ | X | X | ⊚ | ○ | ⊚ |

(Evaluation Results)

The bonding wires according to Working Examples 1 through 111 each include a Cu alloy core material and a Pd coating layer formed on the surface of the Cu alloy core material, and the bonding wire contains In, a concentration of In is 0.011 to 1.2% by mass relative to the entire wire, and a thickness of the Pd coating layer is 0.015 to 0.150 μm. It has been revealed that with this configuration the bonding wires according to Working Examples 1 through 111 can achieve the reliability of the ball bonded part in the HAST test in the high temperature and high humidity environment of a temperature of 130° C. and a relative humidity of 85% RH with 5 V bias applied. It has been revealed from Working Examples 12 and 13 that if a concentration of In is 0.031% by mass or more relative to the entire wire, the ball bonding reliability in the HAST test is determined to be a symbol of "circle" and that the range is more preferable concentration range. It has been revealed from Working Examples 14 through 24 and 47 through 111 that if a concentration of In is 0.100% by mass or more relative to the entire wire, the ball bonding reliability in the HAST test is determined to be a symbol of "double circle" and that the range is further preferable concentration range.

In contrast, in Comparative Examples 1 through 3 and 7 through 9, a concentration of In was out of the lower limit, and the reliability of the ball bonded part was not obtained in the HAST test. In Comparative Examples 4 through 6 and 10 through 13, a concentration of In was cut of the upper limit, and the FAB shape and the wedge bondability were faulty. In Comparative Examples 1, 4, 7 and 19, a thickness of the Pd coating layer was out of the lower limit, and the FAB shape was faulty.

In the working examples further including an Au skin layer on the Pd coating layer, it has been revealed that excellent wedge bondability can be obtained when a thickness of the Au skin layer is 0.0005 to 0.050 μm.

In Working Examples 25 through 36, 47 through 74, and 81 through 111, it has been revealed that the high-temperature reliability of the ball bonded part by the HTS evaluation is favorable and the leaning is favorable because the Cu alloy core material further contains Pt, Pd, Rh and Ni, and a concentration of each of these elements contained in the wire is 0.05 to 1.2% by mass.

In Working Examples 37 through 46, 59 through 106, 108, 109 and 111, the crushed shape of the ball bonded part was favorable because the bonding wire further contains at least one element selected from B, P, Mg, Ga and Ge, and a concentration of each of the elements was 1 ppm by mass or more relative to the entire wire.

The invention claimed is:

1. A bonding wire for a semiconductor device comprising:
a Cu alloy core material; and
a Pd coating layer formed on a surface of the Cu alloy core material, wherein
the bonding wire contains In,
a concentration of In is 0.031% by mass or more and 1.2% by mass or less relative to the entire wire, and
a thickness of the Pd coating layer is 0.015 µm or more and 0.150 µm or less.

2. The bonding wire for a semiconductor device according to claim 1, wherein
the Cu alloy core material contains at least one element selected from Pt, Pd, Rh and Ni, and
a concentration of each of the elements contained in the Cu alloy core material is 0.05% by mass or more and 1.2% by mass or less.

3. The bonding wire for a semiconductor device according to claim 1, further comprising an Au skin layer on the Pd coating layer.

4. The bonding wire for a semiconductor device according to claim 3, wherein a thickness of the Au skin layer is 0.0005 µm or more and 0.050 µm or less.

5. The bonding wire for a semiconductor device according to claim 1, wherein
the bonding wire further contains at least one element selected from B, P, Mg, Ga and Ge, and
a concentration of each of the elements is 1 ppm by mass or more and 100 ppm by mass or less relative to the entire wire.

6. The bonding wire for a semiconductor device according to claim 1, wherein, in a measurement result when measuring crystal orientations on a surface of the bonding wire, a crystal orientation <111> angled at 15 degrees or less to a longitudinal direction of the bonding wire has a proportion of 30% or more and 100% or less among crystal orientations in the wire longitudinal direction.

7. The bonding wire for a semiconductor device according to claim 1, wherein a concentration of In is 0.1% by mass or more and 1.2% by mass or less relative to the entire wire.

8. A bonding wire for ball bonding, comprising:
a Cu alloy core material; and
a Pd coating layer formed on a surface of the Cu alloy core material, wherein
the bonding wire contains In,
a concentration of In is 0.031% by mass or more and 1.2% by mass or less relative to the entire wire,
a thickness of the Pd coating layer is 0.015 µm or more and 0.150 µm or less, and
a ball to be formed when the ball bonding is performed comprises an alloy containing Pd, Cu and In.

* * * * *